United States Patent [19]
Kuriyama et al.

[11] Patent Number: 5,559,744
[45] Date of Patent: Sep. 24, 1996

[54] SEMICONDUCTOR INTEGRATED CIRCUIT DEVICE HAVING A TEST MODE SETTING CIRCUIT

[75] Inventors: Masao Kuriyama; Hironori Banba, both of Kawasaki, Japan

[73] Assignee: Kabushiki Kaisha Toshiba, Kawasaki, Japan

[21] Appl. No.: 389,165

[22] Filed: Feb. 15, 1995

[30] Foreign Application Priority Data

Feb. 15, 1994 [JP] Japan ................................. 6-018119

[51] Int. Cl.⁶ ................................................ G11C 7/00
[52] U.S. Cl. ........................................ 365/201; 365/230.08
[58] Field of Search ............................... 365/201, 230.08, 365/226, 230.06; 371/22.1, 22.3

[56] References Cited

U.S. PATENT DOCUMENTS

| | | | |
|---|---|---|---|
| 4,580,246 | 4/1986 | Sibigtroth | 365/201 |
| 5,373,472 | 12/1994 | Ohsawa | 365/201 |
| 5,452,253 | 9/1995 | Choi | 365/201 |

OTHER PUBLICATIONS

IEEE. Journal of Solid–State Circuits, vol. SC–22, No. 5; Oct. 1987, pp. 669–675, N. Ohtsuka et al., "A 4–Mbit CMOS EPROM".

*Primary Examiner*—A. Zarabian
*Attorney, Agent, or Firm*—Banner & Allegretti, Ltd.

[57] ABSTRACT

A semiconductor integrated circuit device includes a test mode setting circuit. The test mode setting circuit includes an AND circuit for deriving the logical AND of a test mode setting permission signal and a signal input from a pin, and a latch circuit which is set by an output of the AND circuit and reset by a test mode setting release signal. After the test content is latched in the latch circuit in response to a test mode setting permission signal, the test is effected according to the setting of state of the semiconductor integrated circuit device and data latched in the latch circuit.

34 Claims, 7 Drawing Sheets

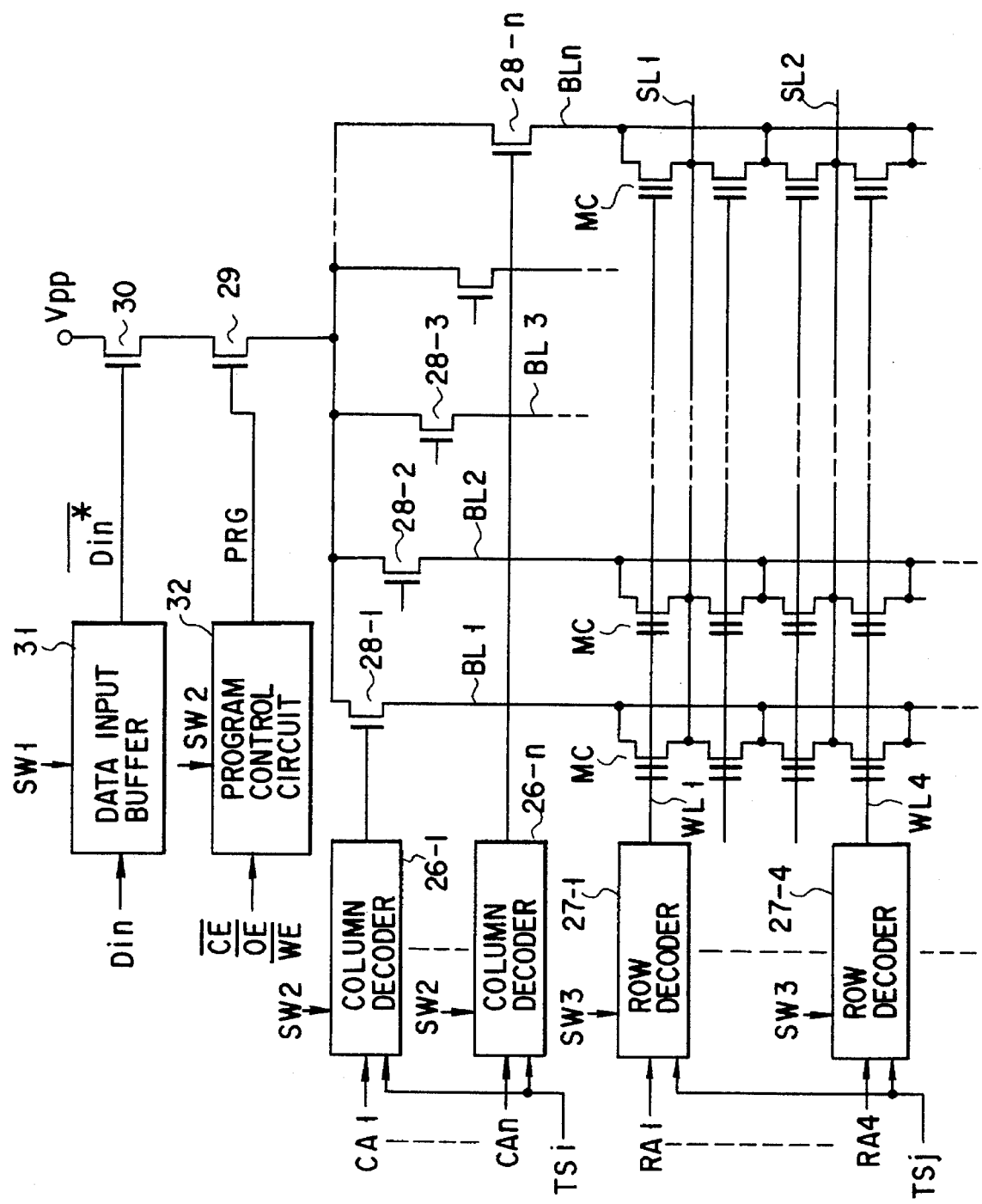
F I G. 4

SEMICONDUCTOR INTEGRATED CIRCUIT DEVICE HAVING A TEST MODE SETTING CIRCUIT

BACKGROUND OF THE INVENTION

1. Field of the Invention

This invention relates to a semiconductor integrated circuit device having a test mode setting circuit.

2. Description of the Related Art

Setting of a test mode in a semiconductor integrated circuit device, for example, a semiconductor memory device is effected by supplying a test signal when a voltage ("HH" level=approx. 12 V) higher than a normal input level (0 to 5 V) is applied to a pin which has no connection to the test, for example, an address pin. This type of test mode setting circuit is described in IEEE JOURNAL OF SOLID-STATE CIRCUITS, VOL. SC-22, NO. 5, OCTOBER 1987 pp. 669–675 OHTSUKA et al.; A 4-Mbit CMOS EPROM, for example.

FIG. 1 shows the conventional test mode setting circuit described above and the peripheral circuit portion thereof in the semiconductor memory device. As shown in FIG. 1, an address signal Add input to an address input pad 10 is supplied to an address buffer 11 and a high potential detection circuit 12 acting as a test mode setting circuit. Internal address signals Ai, $\overline{Ai}$ are supplied from the address buffer 11 to a decoder (not shown) and a test signal TSi for switching the semiconductor memory device into the test mode is output from the high potential detection circuit 12.

The address buffer 11 includes P-channel MOS transistors 13, 14, N-channel MOS transistors 15, 16 and inverters 17 to 20. The current paths of the MOS transistors 13, 14, 15 are connected in series between the power sources Vcc and Vss. The current path of the MOS transistor 16 is connected between a common connection node of the MOS transistors 14 and 15 and the ground node Vss. A chip enable signal CE is supplied to the gates of the MOS transistors 13, 16. The gates of the MOS transistors 14, 15 are connected to the address input pad 10. The input terminal of the inverter 17 is connected to the drain common connection node of the MOS transistors 14, 15, 16 and the output terminal thereof is connected to the input terminal of the inverter 18. The input terminal of the inverter 19 is connected to the output terminal of the inverter 18 and an internal address signal Ai is output from the output terminal thereof. Further, the input terminal of the inverter 20 is connected to the output terminal of the inverter 19 and an internal address signal $\overline{Ai}$ is output from the output terminal thereof.

The high potential detection circuit 12 includes P-channel MOS transistors 21, 22, N-channel MOS transistor 23 and inverters 24 and 25. The source of the MOS transistor 21 is connected to the address input pad 10 and the gate and drain thereof are connected to the source of the MOS transistor 22. The gate of the MOS transistor 22 is applied with the power source voltage Vcc and the drain thereof is connected to the drain of the MOS transistor 23. The gate of the MOS transistor 23 is applied with the power source voltage Vcc and the source thereof is connected to the ground node Vss. The input terminal of the inverter 24 is connected to a drain common connection node of the MOS transistors 22, 23 and the output terminal thereof is connected to the input terminal of the inverter 25. A test signal TSi for switching the semiconductor memory device into the test mode is output from the output terminal of inverter 25.

With the above construction, since the MOS transistor 13 is set in the OFF state and the MOS transistor 16 is set in the ON state when the chip enable signal CE is set at the "H" level, the input terminal of the inverter 17 is set to the "L" level. As a result, the internal address signal Ai is fixed at the "H" level and the internal address signal $\overline{Ai}$ is fixed at the "L" level.

When the chip enable signal CE is inverted to the "L" level, the MOS transistor 13 is set into the ON state, the MOS transistor 16 is set into the OFF state, and the address signal Add supplied to the address input pad 10 is inverted by a CMOS inverter constructed by the MOS transistors 14 and 15 and then supplied to the input terminal of the inverter 17. As a result, the internal address signal Ai becomes a signal which is in phase with the address signal Add supplied externally, the internal address signal $\overline{Ai}$ becomes a signal which has an inverted phase with respect to the address signal Add, and the internal address signals Ai, $\overline{Ai}$ are supplied to a row decoder or column decoder.

When a potential applied to the address input pad 10 is set at the level (for example, 0 to 5 V) of the address signal Add, the MOS transistor 22 is set in the OFF state, the MOS transistor 23 is set in the ON state and the test signal TSi output from the inverter 25 is kept at the "L" level in the high potential detection circuit. On the other hand, when a potential of "HH" level is applied to the address input pad 10, the MOS transistors 21, 22 are set into the ON state and the MOS transistor 23 is set into the OFF state, and therefore, the input terminal of the inverter 24 is set to the "H" level. As a result, the test signal TSi output from the inverter 25 is set to the "H" level so as to set the test mode.

The test mode setting circuit constructed by the high potential detection circuit has an advantage that the test can be effected even after the chip is sealed into the package and an increase in the number of pins can be suppressed and is widely used.

Now, suppose the case of gate disturb test in a non-volatile semiconductor memory device (such as EPROM, flash EEPROM) as an example of a case wherein the above test mode setting circuit is used. Since all of the word lines are set in the selected state irrespective of an input address in the gate disturb test, one address input pin for the row address can be used as a test mode setting pin for inputting the "HH" level.

However, in the test such as the test mode for the sense amplifiers, for example, in which it is necessary to input all of the control signals and all of the address signals, a problem that the test mode setting pin cannot be defined occurs. Further, since the number of pins is limited, the number of test modes effected with the chip sealed in the package is limited. For example, it is further difficult to effect the test having a combination of a large number of test items such as changing or switching of part of the settings of the power source circuit and application of the same stress as that to the word line to another transistor (for example, Y selector) in the gate disturb test.

Further, when the test is effected, it is necessary to generate a high voltage signal of 12 V. However, since the IC tester does not have many terminals capable of generating such a high voltage, it becomes necessary to take a lot of labor and time for preparing the test.

Particularly, in the semiconductor memory device having the conventional test mode setting circuit as shown in FIG. 1, the types, the combinations and the number of tests which can be effected are limited, and therefore, the possibility of interference with the development and the analysis for defects becomes high.

SUMMARY OF THE INVENTION

Accordingly, an object of this invention is to provide a semiconductor integrated circuit device having a test mode setting circuit capable of setting the test mode without inputting a high potential.

Further, another object of this invention is to provide a semiconductor integrated circuit device having a test mode setting circuit in which the test can be effected with all of the pins used.

Still an object of this invention is to provide a semiconductor integrated circuit device having a test mode setting circuit in which the types, the combinations and the number of tests which can be set are not limited by the number of pins and the test having a combination of a large number of test items can be effected.

The above-described objects can be attained by a semiconductor integrated circuit device comprising a test mode setting circuit including an AND circuit for deriving the logical AND of a test mode setting permission signal and a signal input from a pin; and a latch circuit which is set by an output of the AND circuit, which is reset by a test mode setting release signal and which outputs a test signal for switching the mode into the test mode, wherein the test is effected according to the setting of state and data latched in the latch circuit.

Further, the object of this invention can be attained by a semiconductor integrated circuit device comprising a semiconductor memory device; and a test mode setting circuit; wherein the test mode setting circuit includes an AND circuit for deriving the logical AND of a test mode setting permission signal and an address signal input from an address input pad of the semiconductor memory device; and a latch circuit which is set by an output of the AND circuit, which is reset by a test mode setting release signal and which outputs a test signal for setting the semiconductor memory device into the test mode, and the test is effected according to the setting of state of the semiconductor memory device and data latched in the latch circuit.

With the above construction, since data is latched by a logical AND signal of the test mode setting permission signal and the signal input from the pin, a test signal for setting the test mode is output from the latch circuit to switch the device into the test mode, and the test can be effected according to the test signal and the setting of the state, thus the test mode can be set without inputting a high potential. Therefore, no limitation is imposed on the pins for switching the device into the test mode and the test can be effected with all of the pins used. Further, since the types, the combinations and the number of tests which can be set are not limited by the number of pins, the test having a combination of a large number of test items can be effected.

In a case where the semiconductor integrated circuit device is a semiconductor memory device, or the semiconductor memory device is contained in the semiconductor integrated circuit device, the test in which all of the control signals and all of the address signals are input can be effected as in the test mode for sense amplifiers. Further, the number of test modes which can be effected with the device sealed in a package can be significantly increased when the gate disturb test is effected, the test having a combination of a large number of test items such as changing or switching of part of the settings of the power source circuit and application of the same stress as that to the word line to another transistor (for example, Y selector) can be effected, and thus, it is particularly suitable for testing the semiconductor memory device.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4 is a circuit diagram showing a circuit section associated with the gate disturb test in a non-volatile semiconductor memory device;

DETAILED DESCRIPTION OF THE PREFERRED EMBODIMENTS

Figure 1:
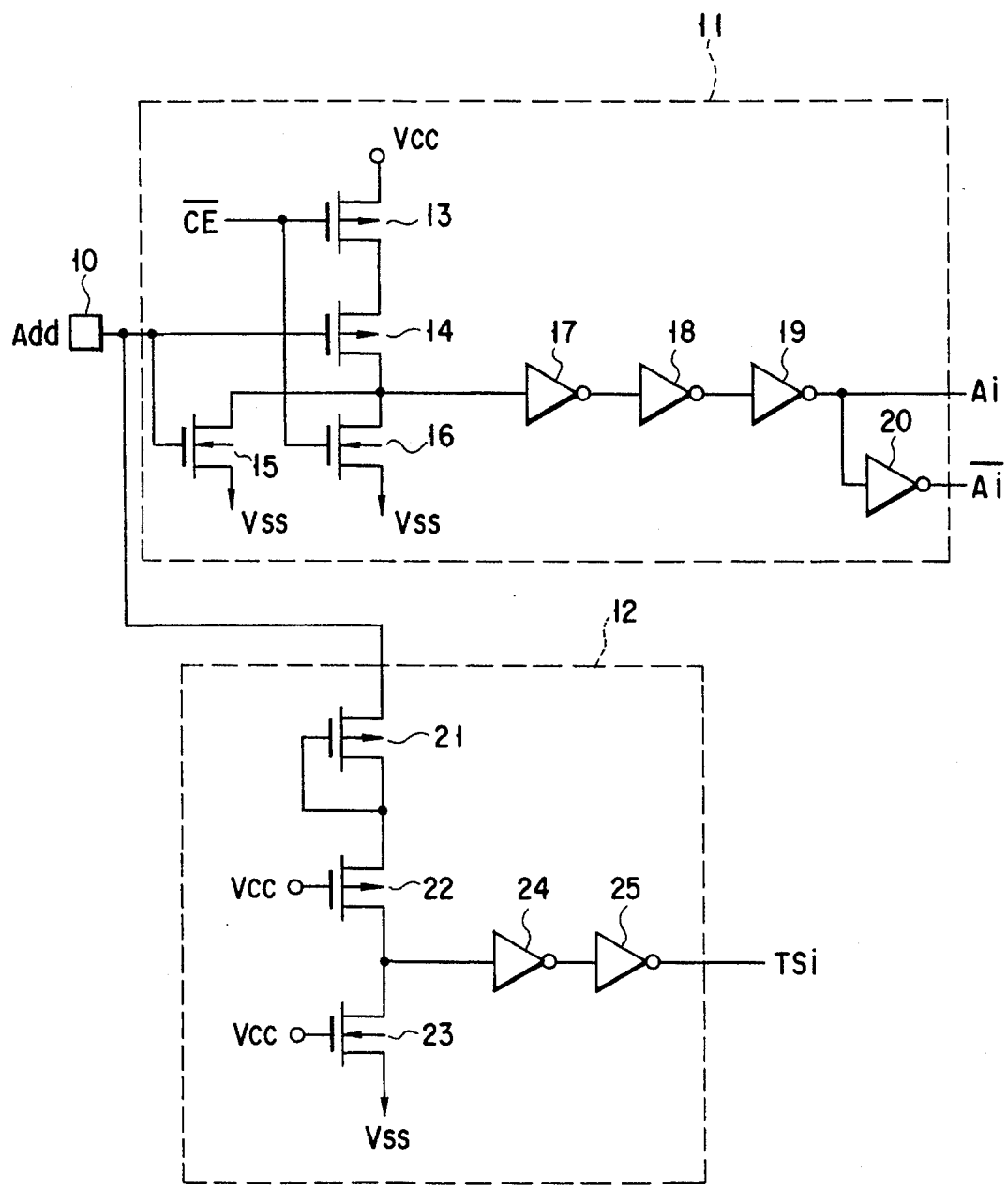
FIG. 1 is a circuit diagram showing the test mode setting circuit of the conventional semiconductor memory device and the peripheral circuit portion thereof, for illustrating the conventional semiconductor integrated circuit device.
Figure 2:
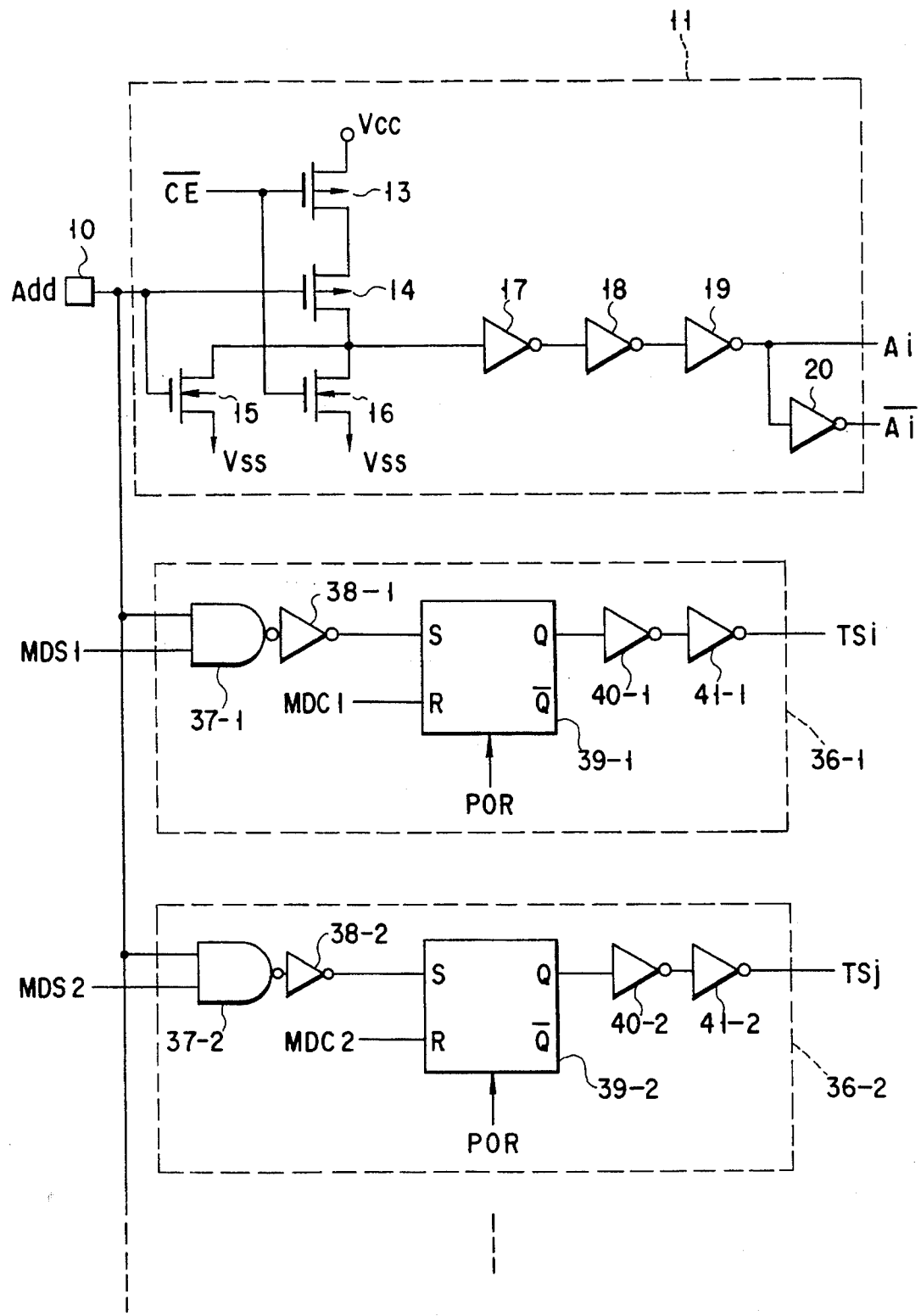
FIG. 2 is a circuit diagram showing the test mode setting circuit of a semiconductor memory device and the peripheral circuit portion thereof, for illustrating a semiconductor integrated circuit device according to one embodiment of this invention.

FIG. 2 shows the test mode setting circuit of a semiconductor memory device and the peripheral circuit portion thereof and illustrates a semiconductor integrated circuit device according to one embodiment of this invention. An address input pad 10 is connected to the input terminal of an address buffer 11 with the same circuit construction as the circuit shown in FIG. 1. That is, the address input pad 11 is connected to the gates of a P-channel MOS transistor 14 and an N-channel MOS transistor 15. The source of the MOS transistor 15 is connected to the ground node Vss. A path between the drain and source of a P-channel MOS transistor 13 is connected between the source of the MOS transistor 14 and the power source terminal Vcc, and the gate of the MOS transistor 13 is applied with a chip enable signal CE. A path between the drain and source of an N-channel MOS transistor 16 is connected between the drain of each of the MOS transistors 14 and 15 and the ground node Vss, and the gate of the MOS transistor 16 is applied with the chip enable signal CE. The drains of the MOS transistors 14 to 16 are connected to the input terminal of an inverter 17 and the output terminal of the inverter 17 is connected to the input terminal of an inverter 18. The output terminal of the inverter 18 is connected to the input terminal of an inverter 19 and an internal address signal Ai is output from the output terminal of the inverter 19. Further, the output terminal of the inverter 19 is connected to the input terminal of an inverter 20 and an internal address signal $\overline{Ai}$ is output from the output terminal of the inverter 20.

Further, the address pad 10 is connected to test mode setting circuits 36-1, 36-2, .... Each of the test mode setting circuits 36-1, 36-2, ... basically latches a logical AND value of an address signal Add supplied from the address input pad 10 and a corresponding one of mode setting permission signals MDS1, MDS2, ... and is reset by a corresponding one of mode setting release signals MDC1, MDC2, ....

The test mode setting circuit 36-1 includes a NAND gate 37-1, inverter 38-1, latch circuit (S/R flip-flop circuit) 39-1 and inverters 40-1, 41-1. One input terminal of the NAND gate 37-1 is connected to the address input pad 10, and the other input terminal thereof is supplied with the mode setting permission signal MDS1. The output terminal of the NAND gate 37-1 is connected to the input terminal of the inverter 38-1 whose output terminal is connected to the set input terminal S of the latch circuit 39-1. When the mode setting release signal MDC1 is supplied to the reset input terminal R of the latch circuit 39-1, the latch circuit is reset, and a power-ON reset signal POR is supplied to the latch circuit so as to reset the latch circuit at the time of power ON. The output terminal Q of the latch circuit 39-1 is connected to the input terminal of the inverter 40-1 whose output terminal is connected to the input terminal of the inverter 41-1. A test signal TSi is output from the output terminal of the inverter 41-1.

Like the test mode setting circuit 36-1, the test mode setting circuit 36-2 includes a NAND gate 37-2, inverter 38-2, latch circuit (S/R flip-flop circuit) 39-2 and inverters 40-2, 41-2 to attain the same circuit construction. The circuit 36-2 is supplied with a mode setting permission signal MDS2, mode setting release signal MDC2 and power-ON reset signal POR and outputs a test signal TSj. Although not shown in the drawing, it is possible to additionally provide a test mode setting circuit or circuits with the same circuit construction as required.

Figure 3:
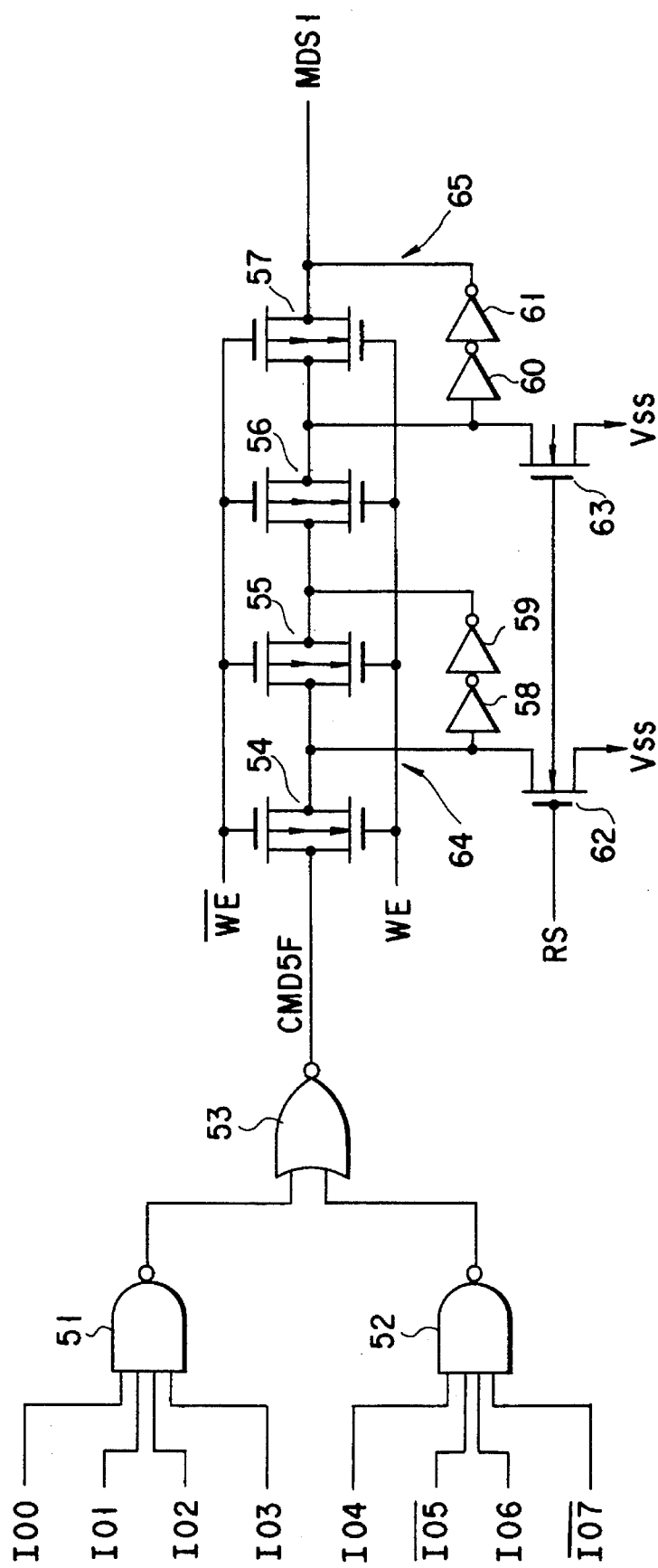
FIG. 3 is a circuit diagram showing an example of the construction of a circuit for outputting a test mode setting permission signal in the circuit shown in FIG. 2 when a command is input to switch the mode into the test mode.

FIG. 3 shows an example of the construction of a circuit for supplying the test mode setting permission signal MDS1 to the test mode setting circuit 36-1 when a command is input. The circuit includes NAND gates 51, 52, NOR gate 53, transfer gates 54 to 57, inverters 58 to 61, and N-channel MOS transistors 62, 63. The NAND gate 51 is supplied with signals IO0 to IO3 supplied to a data input buffer (not shown) as data. Further, the NAND gate 52 is supplied with signals IO4, $\overline{IO5}$, IO6, $\overline{IO7}$ supplied to the data input buffer as data. Output signals of the NAND gates 51 and 52 are supplied to the NOR gate 53 and an output signal CMD5F of the NOR gate 53 is supplied to one end of the transfer gate 54. The transfer gates 54 to 57 are connected in series, the P-channel MOS transistor is controlled by a write-in signal $\overline{WE}$ and the N-channel MOS transistor is controlled by a write-in signal WE. The inverters 58, 59 are connected between two ends of the transfer gate 55 to construct a latch circuit 64. Likewise, the inverters 60, 61 are connected between two ends of the transfer gate 57 to construct a latch circuit 65. The drain of the N-channel MOS transistor 62 is connected to a connection node of the transfer gates 54 and 55, the source thereof is connected to the ground node Vss, and the gate thereof is supplied with a reset signal RS. Likewise, the drain of the N-channel MOS transistor 63 is connected to a connection node of the transfer gates 56 and 57, the source thereof is connected to the ground node Vss, and the gate thereof is supplied with a reset signal RS. By the reset signal RS, the signal CMD5F latched in the latch circuit 64, 65 is reset. The test mode setting permission signal MDS1 is output via the transfer gates 54 to 57. A circuit for outputting the test mode setting permission signal MDS2 can be constructed in the same manner as in the the case of FIG. 3.

In the circuit shown in FIG. 3, the setting of the test mode is effected according to the following procedure. In this case, the test mode setting circuit 36-1 is used as an example. First, the mode setting permission signal MDS1 is set to the "H" level by a command input. That is, the mode setting permission signal MDS1 is set to the "H" level by setting the signals IO0 to IO4 and IO6 to the "H" level and setting the signals $\overline{IO5}$, $\overline{IO7}$ to the "H" level to set the signal CMD5F to the "H" level and then latching the signal CMD5F into the latch circuits 64, 65 in response to the write-in signals $\overline{WE}$, WE. Next, in a state in which the mode setting permission signal MDS1 is set at the "H" level, the address signal Add is supplied to the address input pad 10 to set the latch circuit 39-1 and set the test mode (the signal TSi is set to the "H" level). After this, the mode setting permission signal MDS1 is returned to the "L" level by a command input (by switching at least one of the signals IO1 to IO4, IO6, signals $\overline{IO5}$, $\overline{IO7}$). Then, after the semiconductor integrated circuit device is set to a desired operation state (for example, the readout state, program state, erasing state in the case of a semiconductor memory device), the test is effected by control of the test signal TSi.

On the other hand, releasing of the test mode is effected by the following procedure. First, a command is input to set the mode setting release signal MDC1 to the "H" level. As a result, the latch circuit 39-1 is reset and the test signal TSi is set to the "L" level. Next, a command is input to set the mode setting release signal MDC1 to the "L" level.

By setting or releasing the test mode of the test mode setting circuits 36-2, ... in the same manner, a different type of test or a combination of different types of tests is effected.

With the above construction, the test signals TSi, TSj, ... are kept unchanged and maintained at the "L" level irrespective the level of the address signal Add supplied to the address input pad 10 when the mode setting permission signals MDS1, MDS2, ... are set at the "L" level. Further, since the test mode setting circuit can be controlled without applying a high potential, the test pins for switching the device into the test mode are not limited, and the test using all of the pins such as address input pins and input pins of a control signal in the case of the semiconductor memory device can be effected. Further, since a plurality of test mode setting circuits can be provided for one pin, the test can be effected in a large number of test modes irrespective of the number of pins of the package. Further, it is possible to change part of the settings of the power source circuit at the time of disturb test of the semiconductor memory device and effect the test according to the changing, for example. Further, it becomes possible to easily effect the test combined with various conditions such as whether or not the test for another transistor or circuit is simultaneously effected, whether or not stress is applied to part of the memory cell array or the like. Since the test mode can be set without applying a high potential, the test can be effected only by use of the normal output terminal (0 to 5 V output) of the IC tester and preparation for the test can be simplified.

In the embodiment shown in FIG. 2, a case wherein an address signal Add input from the address input pad 10 is used as an input signal to the test mode setting circuit is explained, but it is also possible to use a signal at the input terminal or output terminal of the inverter 17 shown in FIG. 2, an internal address signal Ai or $\overline{Ai}$, and it is possible to connect the test mode setting circuits 36-1, 36-2, . . . to other control pins and I/O pins and use a signal input via the above pins, and thus this invention is not limited to the above embodiment. Further, a case wherein the test mode is set or released by use of a command is explained, but the same operation can be attained when an algorithmic control system for selecting the state by a control signal or a combination of control signals is used.

Next, application of this invention to the gate disturb test in a non-volatile semiconductor memory device (EPROM, flash EEPROM or the like) is explained. FIG. 4 shows a circuit section associated with the gate disturb test in a non-volatile semiconductor memory device. As shown in FIG. 4, column decoders 26-1 to 26-n are supplied with column address signals CA1 to CAn output from address buffers (column address buffers) 11 having the same construction as that of FIG. 2 and a test signal TSi output from the test mode setting circuit 36-1. Row decoders 27-1, . . . , 27-4, . . . are supplied with row address signals RA1, . . . , RA4, . . . output from address buffers (row address buffers) 11 having the same construction as that of FIG. 2 and a test signal TSj output from the test mode setting circuit 36-2. Output signals of the column decoders 26-1 to 26-n are supplied to the gates of column selection transistors 28-1 to 28-n. The current paths of the column selection transistors 28-1 to 28-n are connected at one end thereof to bit lines BL1 to BLn, respectively, and the other ends of the current paths thereof are connected together. Further, the output terminals of the row decoders 27-1, . . . , 27-4, . . . are connected to word lines WL1, . . . , WL4, . . . , respectively. The control gates of cell transistors MC on the same row are connected to a corresponding one of the word lines WL1, . . . , WL4, . . . and the drains of the cell transistors MC on the same column are connected to a corresponding one of the bit lines BL1 to BLn. The cell transistors MC on the adjacent two rows are connected to source lines SL1, SL2, . . . .

The current paths of a control transistor 29 and programming transistor 30 are connected between power source Vpp and a common connection node of the current paths of the column selection transistors 28-1 to 28-n. The gate of the programming transistor 30 is supplied with an output signal $\overline{Din^*}$ of a data input buffer 31. Data Din is input to the buffer 31. The gate of the control transistor 29 is supplied with an output signal (program signal) PRG of a program control circuit 32. The circuit 32 is supplied with control signals such as a chip enable signal CE, output enable signal $\overline{OE}$ and write enable signal $\overline{WE}$.

Figure 5A:
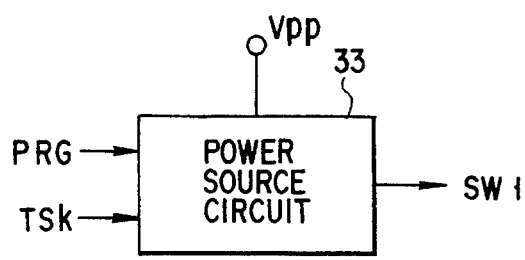
FIGS. 5A, 5B and 5C are circuit diagram showing examples of the construction of a power source circuit for supplying power source voltages to the circuit shown in FIG. 4.
Figure 5C:
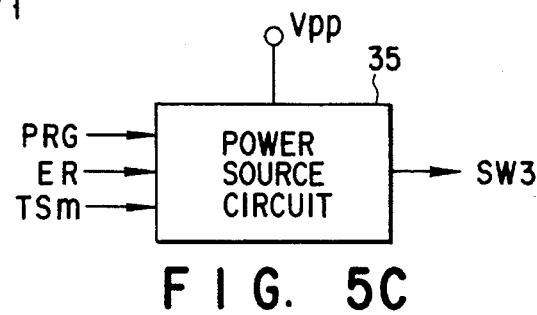
Figure 5B:
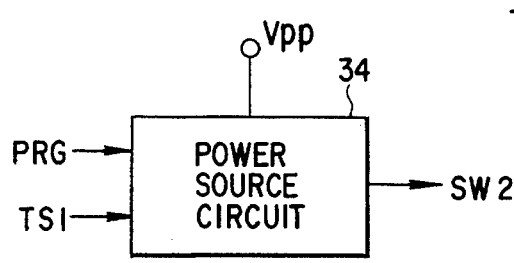

The data input buffer 31 is supplied with a power source SW1 from a power source circuit 33 as shown in FIG. 5A. The power source circuit 33 is operated on the power source voltage Vpp to switch the voltage of the power source SW1 in response to the program signal PRG and test signal TSk. The program control circuit 32 and the column decoders 26-1 to 26-n are supplied with a power source SW2 from a power source circuit 34 as shown in FIG. 5B. The power source circuit 34 is operated on the power source voltage Vpp to switch the voltage of the power source SW2 in response to the program signal PRG and test signal TS1. Further, the row decoders 27-1, . . . , 27-4, . . . are supplied with a power source SW3 from a power source circuit 35 as shown in FIG. 5C. The power source circuit 35 is operated on the power source voltage Vpp to switch the voltage of the power source SW3 in response to the program signal PRG, erase signal ER and test signal TSm.

Figure 6:
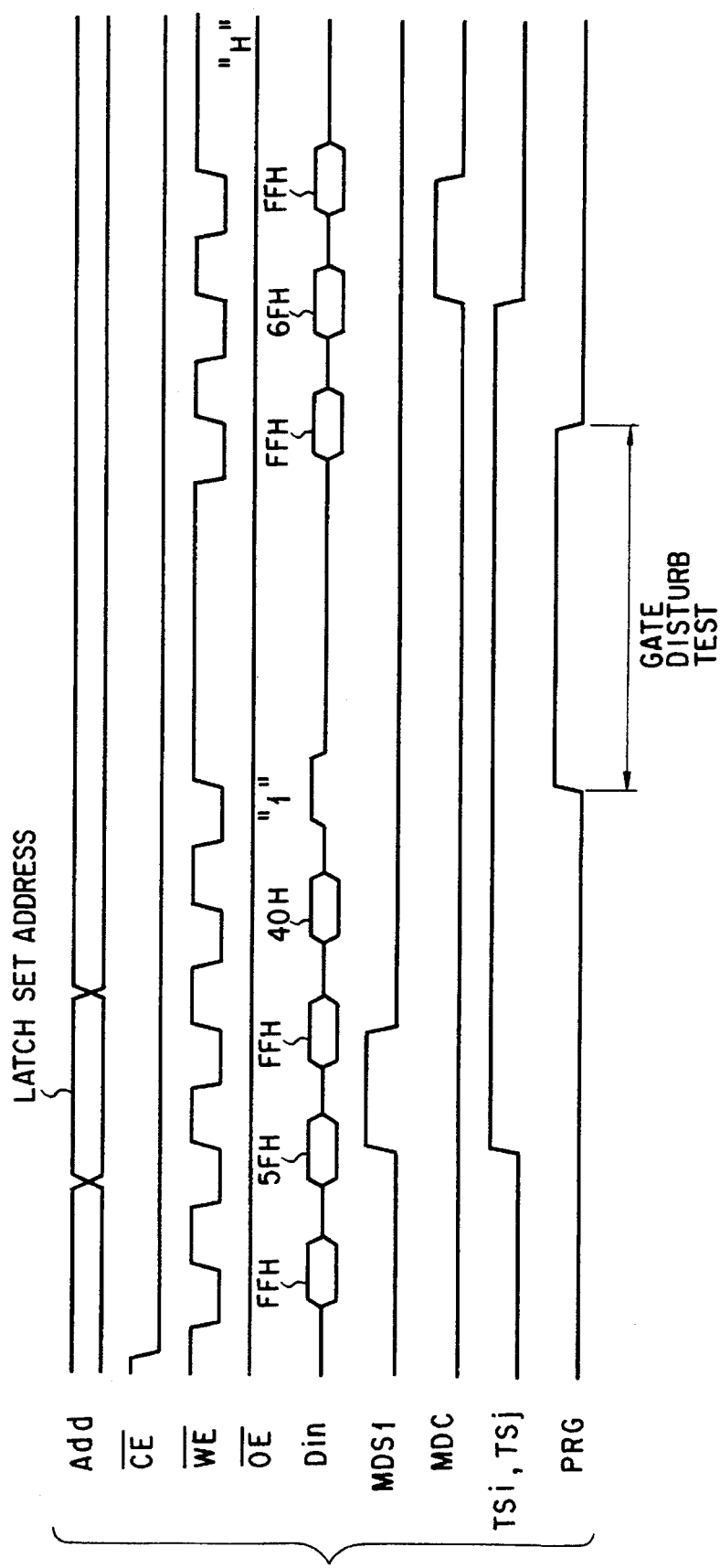
FIG. 6 is a timing chart of various signals at the time of gate disturb test of the circuit shown in FIG. 4.

FIG. 6 is a timing chart of various signals generated when the gate disturb test described above is effected. In FIG. 6, a case wherein the state is set by the input of a command is shown, and "5FH" is a command for setting the test mode, "6FH" is a clear command of the test mode, "40H" is a program command, and "FFH" is a reset (read) command. That is, in this example, the latch circuit is set by the "5FH" command to set the test signal TSi to the "H" level and is reset by the "6FH" command to set the test signal to the "L" level.

With the above construction, when the gate disturb test is effected, the test signal TSi is supplied to the column decoders 26-1 to 26-n so as to set the output of the column decoder 26-1 to the "HH" level (approx. 12 V) and set the outputs of the column decoders 26-2 to 26-n to the "L" level, for example. Further, the test signal TSj is supplied to the row decoders 27-1, . . . , 27-4, . . . so as to select all of the word lines WL1 to WLm and set them to the "HH" level. Next, a control signal (such as a chip enable signal $\overline{CE}$, output enable signal $\overline{OE}$, or write enable signal $\overline{WE}$) is supplied to the program control circuit 32 to set the program signal PRG to the "HH" level and turn ON the MOS transistor 29, thereby setting the semiconductor memory device into the program state. Then, data Din of "H" level is supplied to the data input buffer 31 to set the output signal $\overline{Din^*}$ of the buffer 31 to the "L" level and set the programming transistor 30 into the OFF state.

As a result, the drains of all of the cell transistors are made open and the control gates thereof are set to the Vpp (write potential: approx. 12 V). Therefore, at the time of programming, the gate disturb test for the non-selected cells can be simultaneously effected for all of the cell transistors MC.

If it is desired to effect the test by setting the word line voltage to a higher level than in the programming time at the time of gate disturb test, the output voltage SW3 of the power source circuit 35 shown in FIG. 5C may be designed to be switched according to the test signal TSm.

Further, when it is desired to effect the stress test by setting all of column selection transistors 28-1 to 28-n into the selected state at the same time as the gate disturb test, it is designed such that all of the column decoders 26-1 to 26-n can be selected by the test signal TSi. In this case, it is required to effect the acceleration test by setting stresses applied to the column selection transistors 28-1 to 28-n higher than in the normal writing case, it is designed such that the output voltage SW2 of the power source circuit 34 acting as the power source of the column decoders 26-1 to 26-n can be switched by the test signal TS1.

Thus, even if the gate disturb test is taken as an example, various tests can be freely set and effected and the number of tests is not limited by the number of pins.

As another example of the flexibility of the test, setting of the drain voltage of the cell transistor MC, setting of the voltage of the word line WL, setting of simultaneous programming of multiple word lines and the like are considered when it is desired to effect the program test, and they can be freely set without limiting the other test.

At the time of programming, the drain voltage of each cell transistor MC is defined by the output voltage $\overline{Din^*}$ of the data input buffer 31. When the output voltage Din* of the data input buffer 31 is an output voltage SW1 of the power source circuit 33, a potential equal to "SW1-$V_{TN}$" ($V_{TN}$ is a threshold voltage of the programming transistor 30) appears on the source of the programming transistor 30. Since a voltage SW2 which is sufficiently higher than the voltage SW1 is applied to the gates of the column selection transistors 28-1 to 28-n so as to suppress the resistance components of the column selection transistors 28-1 to 28-n for connecting the programming transistor 30 to the cell transistors MC to a negligibly small value, a potential "SWi-$V_{TN}$" is applied to the drain of the cell transistor MC at the time of programming.

Judging from this, it is understood that the voltage SW1 may be set to be raised by 0.5 V by the test signal TSk when it is desired to set the drain voltage at the time of programming into the cell transistor MC higher than in the normal case by 0.5 V, for example.

Further, it is understood that changing of the word line potential can be attained by changing the output voltage SW3 of the power source circuit 35 of the row decoder by use of the test signal TSk.

Figure 7:
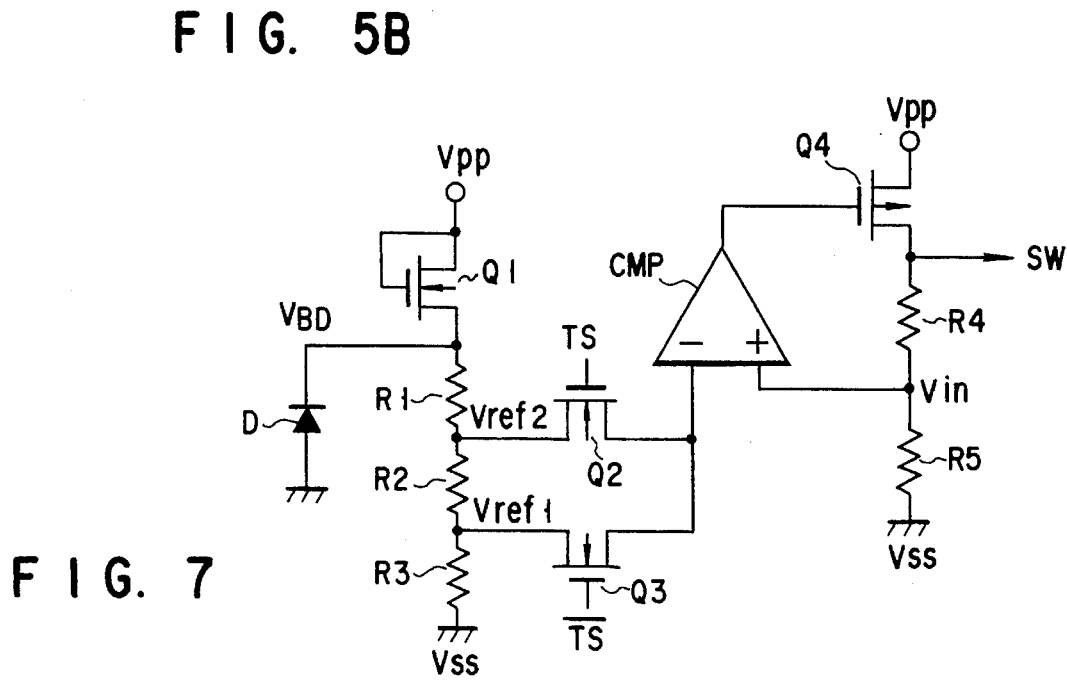
FIG. 7 is a circuit diagram showing an example of the construction of a power source circuit capable of switching an output voltage during the gate disturb test.

FIG. 7 shows an example of the construction of a power source circuit capable of switching an output voltage during the gate disturb test. The power source circuit includes a diode D, N-channel MOS transistors Q1 to Q3, P-channel MOS transistor Q4, comparator CMP and resistors R1 to R5. The current path of the MOS transistor Q1 and the resistors R1 to R3 are connected in series between the power source Vpp and the ground node Vss. The gate of the MOS transistor Q1 is connected to the drain thereof and the diode D is connected between the source of the MOS transistor Q1 and the ground node Vss. One end of the current path of the MOS transistor Q2 is connected to a connection node of the resistors R1 and R2 and the gate thereof is supplied with a test signal $\overline{TS}$. One end of the current path of the MOS transistor Q3 is connected to a connection node of the resistors R2 and R3 and the gate thereof is supplied with a test signal TS. The other ends of the current paths of the MOS transistors Q2, Q3 are connected to the inverting input terminals (−) of the comparator CMP.

Further, the current path of the MOS transistor Q4 and the resistors R4, R5 are connected in series between the power source Vpp and the ground node Vss. The gate of the MOS transistor Q4 is connected to the output terminal of the comparator CMP and the non-inverting input terminal (+) of the comparator CMP is connected to a connection node of the resistors R4 and R5. A voltage SW is derived from a connection node of the MOS transistor Q4 and the resistor R4.

In the power source circuit of FIG. 7, a reference potential $V_{BD}$ is created by use of the breakdown of the diode D. More specifically, when the source potential of the MOS transistor Q1 acting as a load element becomes higher than the reference potential $V_{BD}$, the breakdown of the diode D occurs to lower the potential, thus holding the source potential at the reference potential $V_{BD}$. By dividing the reference potential $V_{BD}$ by use of the resistors R1 to R3, a potential Vref1={r3/(r1+r2+r3)}×$V_{BD}$ and a potential Vref2={(r2+r3)/(r1+r2+r3)}×$V_{BD}$ are created. In this case, r1, r2, r3 are resistances of the resistors R1, R2, R3. The potential Vref1 or Vref2 is selected by setting one of the MOS transistors Q2 and Q3 into the ON state and setting the other into the OFF state by use of the test signals TS, $\overline{TS}$. A selected one of the potentials vref1 and vref2 is compared with a potential vin obtained by dividing the output voltage SW by use of the resistors R4 and R5 to control the conduction state of the load MOS transistor Q4. As a result, the output voltage SW of the power source circuit can be changed according to the level of the test signals TS, $\overline{TS}$.

By providing the power source circuit with the above construction into the circuit shown in FIG. 4 and supplying the output voltage SW to a circuit in which it is desired to change the power source voltage, the voltage can be changed during the gate disturb test.

Further, when it is required to simultaneously write data into a large number of word lines, the test of simultaneously writing data into two word lines can be effected by always setting part of an output signal of the address buffer, for example, address signals A0, $\overline{A0}$ into the double selection state by use of the test signal TS.

Figure 8:
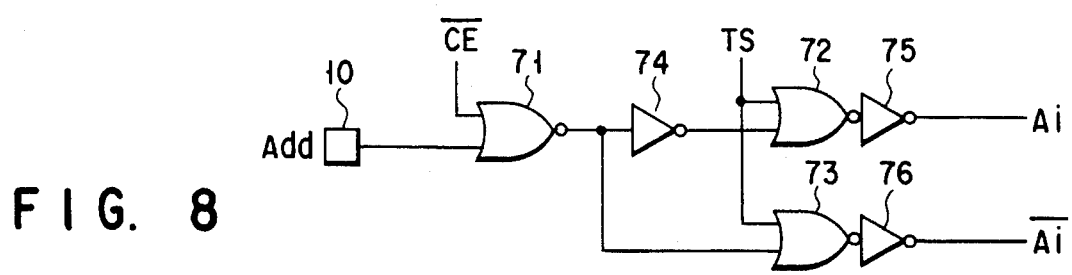
FIG. 8 is a circuit diagram showing an example of the construction of an address buffer capable of simultaneously write data into two word lines.

FIG. 8 shows an example of the construction of an address buffer capable of simultaneously writing data into two word lines. The circuit has a NOR gate in the preceding stage of the output of the address buffer to permit both of the internal address signals Ai and $\overline{Ai}$ to be simultaneously fixed at the "H" level in response to the test signal TS and includes NOR gates 71 to 73 and inverters 74 to 76. One input terminal of the NOR gate 71 is supplied with the chip enable signal $\overline{CE}$ and the other input terminal thereof is supplied with the address signal Add from the address input pad 10. An output of the NOR gate 71 is supplied to the input terminal of the inverter 74 and one input terminal of the NOR gate 73. An output of the inverter 74 is supplied to one input terminal of the NOR gate 72. The other input terminals of the NOR gates 72, 73 are supplied with the test signal TS. Further, an output of the NOR gate 72 is supplied to a decoder (not shown) as an internal address signal Ai via the inverter 75 and an output of the NOR gate 73 is supplied to the decoder as an internal address signal Ai via the inverter 76.

By using the address buffer with the above circuit construction together with the circuit shown in FIG. 4, it becomes possible to simultaneously write data into two word lines.

As described above, if an output of the latch circuit which uses the logical AND signal of a pin input and a test mode setting permission signal as a set signal and uses the test mode release signal as a reset signal is used as a test signal for switching the memory device into the test mode, the test mode can be set without inputting a high potential, an increase in the number of pins can be prevented, all of the control signals and all of the address signals can be freely used at the time of test, and the number of tests which can be set is not limited by the number of pins.

In the above embodiment, the semiconductor memory device is explained as an example, but this invention is not limited to the semiconductor memory device and can be applied to a general semiconductor integrated circuit device which requires similar tests.

Figure 9:
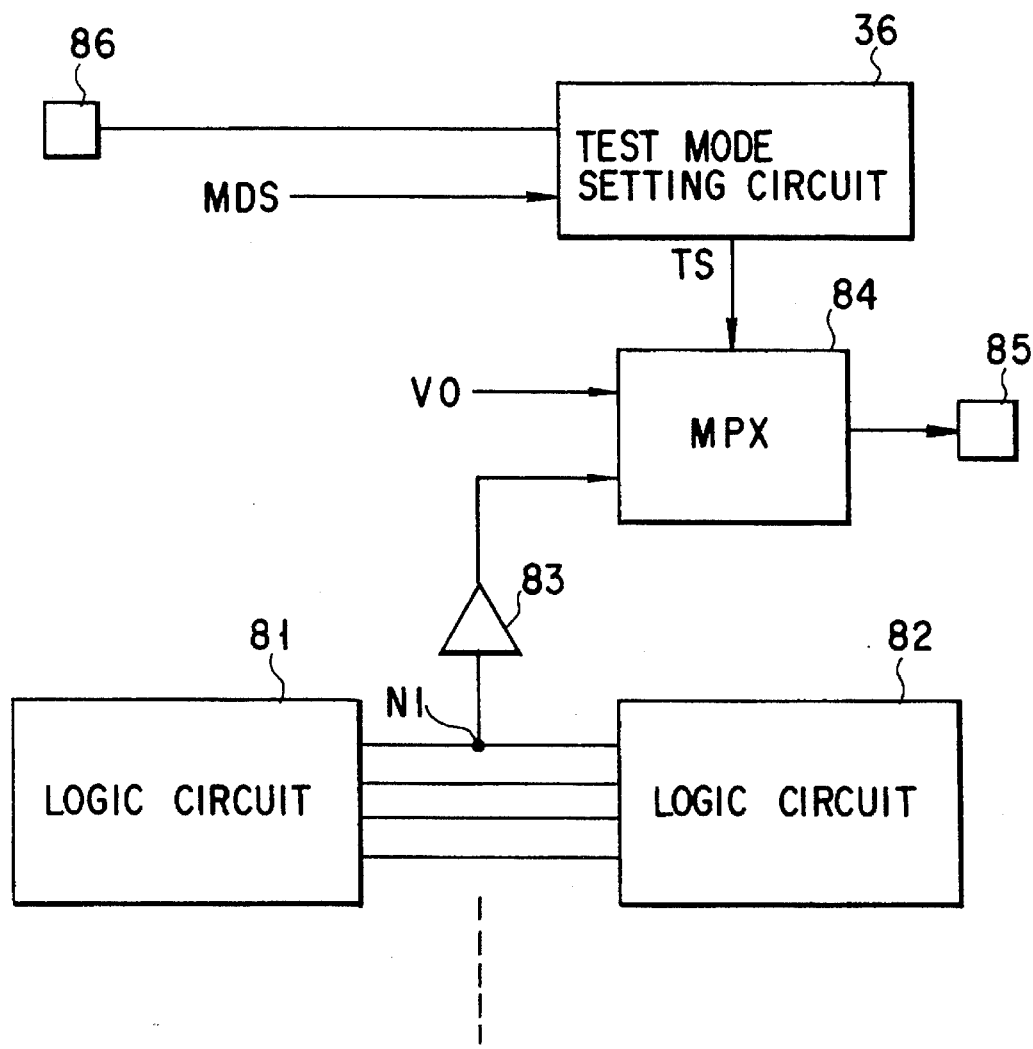
FIG. 9 is a circuit diagram showing a test mode setting circuit for testing a logic circuit in a logic LSI and the peripheral circuit portion thereof, for illustrating a semiconductor integrated circuit device according to another embodiment of this invention.

FIG. 9 shows a test mode setting circuit for testing a logic circuit in a logic LSI and the peripheral circuit portion thereof as another example of the semiconductor integrated circuit device. The input terminal of a buffer 83 is connected to a to-be-observed node N1 between logic circuits 81 and 82. An output signal of the buffer 83 and an output signal VO of the logic LSI in the normal operation mode are supplied to the input terminal of a multiplexer (MPX) 84. The output terminal of the multiplexer 84 is connected to an output pad 85. The multiplexer 84 is supplied with a test signal TS from the test mode setting circuit 36, selects an output signal of the buffer 83 at the time of test, and selects the output signal VO at the time other than the test time, that is, in the normal operation mode. The test mode setting circuit 36 has the same circuit construction as that of FIG. 2 and includes a logical AND circuit for deriving the logical AND of a test mode setting permission signal MDS and a signal supplied to an input pad of the logic LSI, and a latch circuit which is set by an output of the AND circuit and which is reset by a test mode setting release signal. The latch circuit outputs a test signal TS for switching the mode of the multiplexer 84 into the test mode so as select the output signal of the buffer 83.

As a result, it becomes possible to observe the potential level of the to-be-observed node N1 between the logic circuits 81 and 82 to be checked at the time of test from the output pad 85 side. On the other hand, in the normal operation mode, the output signal VO is selected by the multiplexer 84 and output via the output pad 85.

With the above construction, even when it is desired to check a large number of to-be-observed nodes in the logic circuits 82 and 83 provided in the logic LSI, it is only required to provide a test mode setting circuit for the to-be-checked nodes and can effect the test without receiving any influence by the number of pins. Further, other tests and the normal operation will not be limited.

As described above, according to this invention, a semiconductor integrated circuit device having a test mode setting circuit capable of setting the test mode without inputting a high potential can be attained.

Further, a semiconductor integrated circuit device having a test mode setting circuit capable of effecting the test with all of the pins used can be attained.

Further, a semiconductor integrated circuit device having a test mode setting circuit in which the types, the combinations and the number of tests which can be set are not limited by the number of pins and the test having a combination of a large number of test items can be effected.

What is claimed is:

1. A semiconductor integrated circuit device having a test mode, comprising:

a plurality of test mode setting circuits, each having a first terminal which receives an input signal, a second terminal which receives a respective test mode setting permission signal, a third terminal which receives a respective test mode setting release signal, and a fourth terminal from which a respective test signal is output, the first terminals of the plurality of test mode setting circuits being connected in common, each of the plurality of said test mode setting circuits including a logic circuit for logically combining the respective test mode setting permission signal and the input signal, and a latch circuit set by an output of said logic circuit and reset by the respective test mode setting release signal, for outputting the respective test signal for setting the test mode of said semiconductor integrated circuit device.

2. A semiconductor integrated circuit device according to claim 1, further comprising a power source circuit for outputting an output voltage, the output voltage being changed by the respective test signal output from one of said test mode setting circuits.

3. A semiconductor integrated circuit device according to claim 1, wherein a control signal in a chip of said semiconductor integrated circuit device is changed by the respective test signal output from one of said test mode setting circuits.

4. A semiconductor integrated circuit device according to claim 1, further comprising a memory cell array, wherein an address selection signal for selecting an address of said memory cell array is changed by the respective test signal output from one of said test mode setting circuits.

5. A semiconductor integrated circuit device according to claim 1, further comprising a power source circuit and a memory cell, wherein at least one of an output voltage of said power source circuit, a control signal in a chip of said semiconductor integrated circuit device, and an address selection signal for selecting an address of said memory cell is changed by the respective test signal output from one of said test mode setting circuits.

6. A semiconductor integrated circuit device according to claim 1, further comprising an output selection multiplexer controlled by the respective test signal output from one of said test mode setting circuits.

7. A semiconductor integrated circuit device according to claim 1, wherein said logic circuit of each of said test mode setting circuits includes a logic gate supplied with the respective test mode setting signal at a first input terminal and the input signal at a second input terminal, and a first inverter supplied with an output signal of said logic gate, and wherein said latch circuit of each of said test mode setting circuits includes a latch set by an output signal of said first inverter and reset by the respective test mode setting release signal, for outputting the respective test signal for setting the test mode and a second inverter supplied with the respective test signal from said latch and outputting the respective test signal.

8. A semiconductor integrated circuit device according to claim 7, wherein said latch is reset by a power-ON reset signal at power-ON time.

9. A semiconductor integrated circuit device having a test mode, comprising:

a semiconductor memory device having an address input pad;

a test mode setting circuit including a logic circuit for logically combining a test mode setting permission signal and an address signal input from said address input pad, and a latch circuit set by an output from said logic circuit and reset by a test mode setting release signal, for outputting a test signal for setting said semiconductor memory device into the test mode; and a circuit for supplying the test mode setting permission signal to said test mode setting circuit, said circuit including a first logic gate supplied with a first data signal, a second logic gate supplied with a second data signal;

a third logic gate supplied with output signals of said first and second logic gates, a first latch, a first transfer gate for transferring an output signal of said third logic gate to said first latch in response to a write-in signal, a second latch, and a second transfer gate for transferring data latched in said first latch to said second latch in response to the write-in signal data latched in said second latch being output as the test mode setting permission signal.

10. A semiconductor integrated circuit device according to claim 9, further comprising a power source circuit for outputting an output voltage, the output voltage being changed by the test signal.

11. A semiconductor integrated circuit device according to claim 9, wherein a control signal in a chip of said semiconductor integrated circuit device is changed by the test signal.

12. A semiconductor integrated circuit device according to claim 9, wherein an address selection signal for selecting an address of said semiconductor memory device is changed by the test signal.

13. A semiconductor integrated circuit device according to claim 9, further comprising a power source circuit and a memory cell wherein at least one of an output voltage of said power source circuit, a control signal in a chip of said semiconductor integrated circuit device, and an address selection signal for selecting an address of said memory cell is changed by the test signal.

14. A semiconductor integrated circuit device according to claim 9, wherein said logic circuit includes
    a fourth logic gate supplied with the test mode setting signal at a first input terminal and the address signal at a second input terminal, and
    a first inverter supplied with an output signal of said fourth logic gate, and
    wherein said latch circuit includes
    a third latch set by an output signal of said first inverter and reset by the test mode setting release signal, for outputting the test signal for setting the test mode and
    a second inverter supplied with an output signal of said third latch to output the test signal.

15. A semiconductor integrated circuit device according to claim 14, wherein said third latch is reset by a power-ON reset signal at power-ON time.

16. A semiconductor integrated circuit device according to claim 10, wherein said power source circuit includes
    a reference potential generation circuit for generating first and second reference potentials;
    a selection circuit for selecting one of the first and second reference potentials generated by said reference potential generation circuit in response to the test signal;
    a voltage dividing circuit for dividing an output potential;
    a comparison circuit for comparing one of the first and second reference potentials selected by said selection circuit with the output potential of said voltage dividing circuit; and
    a load circuit for setting the output voltage of said power source circuit according to the result of the comparing of said comparison circuit.

17. A semiconductor integrated circuit device according to claim 16, wherein said reference potential generation circuit includes
    a first MOS transistor having a gate and drain connected to a high-voltage power source, and a source,
    first, second, and third resistors connected in series between the source of said first MOS transistor and a ground node, and
    a diode having a cathode connected to the source of said first MOS transistor and an anode connected to ground,
    wherein said selection circuit includes
    a second MOS transistor having a first terminal connected to a node connecting said first and second resistors; and
    a third MOS transistor having a first terminal connected to a node connecting said second and third resistors,
    wherein said voltage dividing circuit includes fourth and fifth resistors connected in series between the output terminal and the ground node,
    wherein said load circuit includes a fourth MOS transistor having a source connected to said high-voltage power source and a drain connected to the output terminal, and a gate, and
    wherein said comparison circuit includes a comparator having an inverted input terminal connected to second terminals of said second and third MOS transistors, a non-inverted input terminal connected to a connection node of said fourth and fifth resistors, and an output terminal connected to the gate of said fourth MOS transistor.

18. A semiconductor integrated circuit device according to claim 9, further comprising an address buffer for simultaneously writing data into two word lines of said semiconductor memory device by setting and fixing internal address signals in a double selection state in response to the test signal.

19. A semiconductor integrated circuit device according to claim 18, wherein said address buffer includes
    a first NOR gate supplied with an address signal at a first input terminal and a chip enable signal at a second input terminal;
    a second NOR gate supplied with an output signal of said first NOR gate at a first input terminal and the test signal at a second input terminal;
    a first inverter supplied with the output signal of said first NOR gate;
    a third NOR gate supplied with an output signal of said first inverter at a first input terminal and the test signal at a second input terminal;
    a second inverter supplied with an output signal of said second NOR gate to output a first internal address signal; and
    a third inverter supplied with an output signal of said third NOR gate to output a second internal address signal which has an inverted phase with respect to the first internal address signal.

20. A semiconductor integrated circuit device having a test mode comprising:
    a semiconductor memory device including
    a memory cell array having memory cells arranged in rows and columns,
    a row decoder for receiving a row address signal and selecting one of the rows of said memory cell array, and
    a column decoder for receiving a column address signal and selecting one of the columns of said memory cell array;
    a first test mode setting circuit for controlling said row decoder by supplying a first test signal to said row decoder in response to an address signal including the row address signal and the column address signal, a first test mode setting permission signal, and a first test mode release signal, said first test mode setting circuit including,
    a first logic circuit for logically combining the first test mode setting permission signal and the address signal, and
    a first latch circuit set by an output of said first logic circuit and reset by the first test mode setting release signal, for outputting the first test signal; and
    a second test mode setting circuit for controlling said column decoder by supplying a second test signal to said column decoder in response to the address signal, a second test mode setting permission signal, and a second test mode release signal, said second test mode setting circuit including, a second logic circuit for logically combining the second test mode setting permission signal and the address signal, and a second latch circuit set by an output of said second logic circuit and reset by the second test mode setting release signal, for outputting the second test signal.

21. A semiconductor integrated circuit device according to claim 20, further comprising:

a data input buffer which receives data to be written in said memory cells;

a program control circuit for generating a program signal in response to a control signal and controlling a program state of said semiconductor memory device;

a first power source circuit for selectively supplying different power source voltages to said data input buffer in response to the program signal and a third test signal;

a second power source circuit for selectively supplying different power source voltages to said program control circuit in response to the program signal and a fourth test signal; and a third power source circuit for selectively supplying different power source voltages to said row decoder in response to the program signal, an erasing signal, and a fifth test signal.

22. A semiconductor integrated circuit device according to claim 21, further comprising:

column selecting transistors having first terminals connected to bit lines in said memory cell array and second terminals connected in common, said column selecting transistors being ON/OFF controlled by an output signal of said column decoder;

a control transistor having a first terminal connected to the second terminals of said column selecting transistors, said control transistor being ON/OFF controlled by the program signal; and a write transistor having a first terminal connected to a second terminal of said control transistor and a second terminal connected to a high-voltage power source, said write transistor being ON/OFF controlled by an output signal of said data input buffer.

23. A semiconductor integrated circuit device according to claim 21, wherein said first power source circuit includes a first reference potential generation circuit for generating first and second reference potentials, a first selecting circuit for selecting one of the first and second reference potentials in response to the third test signal, a first voltage dividing circuit for dividing a first output potential, a first comparison circuit for comparing the selected one of the first and second reference potentials and the first output potential, and a first load circuit for setting a potential of an output terminal of said first power source circuit in response to the result of the comparing of said first comparison circuit, wherein said second power source circuit includes a second reference potential generation circuit for generating third and fourth reference potentials, a second selecting circuit for selecting one of the third and fourth reference potentials in response to the fourth test signal, a second voltage dividing circuit for dividing a second output potential, a second comparison circuit for comparing the selected one of the third and fourth reference voltages and the second output potential, and a second load circuit for setting a potential of an output terminal of said second power source circuit in response to the result of the comparing of said first comparison circuit, and wherein said third power source circuit includes a third reference potential generation circuit for generating fifth and sixth reference potentials, a third selecting circuit for selecting one of the fifth and sixth reference potentials in response to the fifth test signal, a third voltage dividing circuit for dividing a third output potential, a third comparison circuit for comparing the selected one of the fifth and sixth reference voltages and the third output potential, and a third load circuit for setting a potential of an output terminal of said third power source circuit in response to the result of the comparing of said third comparison circuit.

24. A semiconductor integrated circuit device according to claim 23, wherein each of said first, second, and third reference potential generation circuits includes, a first MOS transistor having a gate and drain connected to a high-voltage power source, and a source, first, second, and third resistors serially connected between the source of said first MOS transistor and a ground node, and a diode having a cathode connected to the source of said first MOS transistor and an anode connected to ground, wherein each of said first, second, and third selecting circuits includes a second MOS transistor having a first terminal connected to a node connecting said first and second resistors, and a third MOS transistor having a first terminal connected to a node connecting said second and third resistors, wherein each of said first, second, and third voltage dividing circuits has fourth and fifth resistors serially connected between a respective one of the output terminals of said first, second and third power source circuits, and the ground node, wherein each of said first, second, and third load circuits has a fourth MOS transistor having a source connected to the high-voltage power source, a drain connected to the respective one of the output terminals of said first, second, and third power source circuits, and a gate, and wherein each of said first, second, and third comparison circuits has a comparator having an inverting terminal connected to second terminals of said second and third MOS transistors, a non-inverting terminal connected to a connecting point of said fourth and fifth resistors, and an output terminal connected to the gate of said fourth MOS transistor.

25. A semiconductor integrated circuit device according to claim 20, further comprising:

an address input pad supplied with the address signal including the row address signal and the column address signal; and an address buffer connected to said address input pad for receiving and outputting the address signal, wherein said address buffer simultaneously writes data into two word lines of said semiconductor memory device by setting internal address signals in a double selection state in response to the test signal.

26. A semiconductor integrated circuit device according to claim 25, wherein said address buffer includes a first logic gate supplied with the address signal at a first input terminal and a chip enable signal at a second input terminal;

a second logic gate supplied with an output signal of said first logic gate at a first input terminal and the third test signal at a second input terminal, a first inverter supplied with the output signal of said first logic gate, a third logic gate supplied with an output signal of the first inverter at a first input terminal and the third test signal at a second input terminal, a third inverter supplied with an output signal of said second logic gate to output a first internal address signal, and a fourth inverter supplied with an output signal of said third logic gate to output a second internal address signal which has an opposite phase with respect to the first internal address signal.

27. A semiconductor integrated circuit device according to claim 20, wherein said first logic circuit includes a first logic gate supplied with the first test mode setting permission signal at a first input terminal and the address signal input from said address input pad at a second input terminal, and a first inverter supplied with an output signal of said first logic gate, wherein said first latch circuit includes a first latch set by an output signal of said first inverter and reset by the first test mode setting release signal, for outputting the first test signal for setting the test mode, and a second inverter supplied with an output signal of said first latch and outputting the first test signal, wherein said second logic circuit includes a second logic gate supplied with the second test mode setting permission signal at a first input terminal and the address signal at a second input terminal, and a second inverter supplied with an output signal of said second logic gate, and wherein said second latch circuit includes a second latch set by an output signal of said first inverter and reset by the first test mode setting release signal, for outputting the second test signal for setting the test mode, and a second inverter supplied with an output signal of said second latch and outputting the second test signal.

28. A semiconductor integrated circuit device according to claim 27, wherein said first latch and said second latch are respectively reset by a power-ON reset signal at a power-ON time.

29. A semiconductor integrated circuit device according to claim 20, further comprising a circuit for supplying the first test mode setting permission signal to said first test mode setting circuit and the second test mode setting permission signal to said second test mode setting circuit.

30. A semiconductor integrated circuit device according to claim 29, wherein said circuit comprises a first logic gate supplied with a first data signal;

a second logic gate supplied with a second data signal;

a third logic gate supplied with output signals of said first and second logic gates;

a first latch;

a first transfer gate for transferring an output signal of said third logic gate to said first latch in response to a write signal;

a second latch; and a second transfer gate for transferring data latched by said first latch to said second latch in response to the write signal, data latched in said second latch being output as the first or second test mode setting permission signal.

31. A semiconductor integrated circuit device comprising:

a test mode setting circuit supplied with an input signal and a test mode setting permission signal, said test mode setting circuit including a first logic circuit for logically combining the logic signal and the test mode setting permission signal, and a latch circuit set by an output of said first logic circuit and reset by a test mode setting release signal, for outputting a test signal;

a second logic circuit;

a third logic circuit for transferring a signal to/from said second logic circuit;

an output pad; and a multiplexer supplied with a signal of a node between said second and third logic circuits and an output signal of said semiconductor integrated circuit device in normal operation, said multiplexer outputting the signal of the node to said output pad in response to the test signal output from said latch circuit.

32. A semiconductor integrated circuit device according to claim 31, further comprising a buffer having an input terminal connected to the node and an output terminal connected to said multiplexer.

33. A semiconductor integrated circuit device according to claim 31, wherein said first logic circuit includes a logic gate supplied with the test mode setting permission signal at a first input terminal and the signal of the node at a second input terminal, and a first inverter supplied with an output signal of said logic gate, and wherein said latch circuit includes a latch set by an output signal of said first inverter and reset by the test mode setting release signal, for outputting the test signal for setting a test mode, and a second inverter supplied with an output signal of said latch and outputting the test signal.

34. A semiconductor integrated circuit device according to claim 33, wherein said latch is reset by a power-ON reset signal at a power-ON time.

* * * * *